United States Patent [19]

Holloway

[11] 4,080,723
[45] Mar. 28, 1978

[54] METHOD FOR MAKING AND USING A GROUP IV-VI SEMICONDUCTOR

[75] Inventor: Henry Holloway, Ann Arbor, Mich.

[73] Assignee: Ford Motor Company, Dearborn, Mich.

[21] Appl. No.: 781,377

[22] Filed: Mar. 25, 1977

[51] Int. Cl.$^2$ .................. H01L 7/18; H01L 27/14
[52] U.S. Cl. .............................. 29/584; 357/4; 357/14; 357/30; 357/61
[58] Field of Search ............. 357/30, 4, 13, 14, 61; 29/584

[56] References Cited

U.S. PATENT DOCUMENTS

| 3,647,197 | 3/1972 | Holloway | 263/47 R |
|---|---|---|---|
| 3,767,984 | 10/1973 | Shinoda | 357/16 |
| 3,779,801 | 12/1973 | Holloway et al. | 117/201 |
| 3,860,945 | 1/1975 | Dawson | 357/14 |

OTHER PUBLICATIONS

Holloway et al., *Appl. Phys. Letts.*, vol. 30, No. 4, Feb. 15, 1977, pp. 210-212.
Holloway et al., *Appl. Phys. Lett.*, vol. 19, No. 9, Nov. 1, 1971, pp. 318-319.
Andrews et al., *Appl. Phys. Lett.*, vol. 26, No. 8, Apr. 15, 1975, pp. 285-287.
Holloway et al., *Jour. of Appl. Phys.*, vol. 41, No. 8, July 1970, pp. 3543-3545.

*Primary Examiner*—Martin R. Edlow
*Attorney, Agent, or Firm*—Robert W. Brown; Clifford L. Sadler

[57] ABSTRACT

A method for making and using a group IV-VI photovoltaic semiconductor diode such that its capacitance is reduced substantially with respect to its capacitance if made and used according to prior art techniques. The capacitance reduction may be obtained without detrimental effect to the detectivity and noise levels of the diode. In the currently preferred form of the method, a thin film of *p* conductivity type semiconductor material, PbTe, is applied to (epitaxially grown on) a cleaved BaF$_2$ substrate. A layer of Pb is deposited on the semiconductor material to form a diode having an *n*+ conductivity type region in the semiconductor material and a depletion region. When the PbTe semiconductor material is applied to the BaF$_2$ substrate, its thickness is limited such that the depletion region extends to the boundary formed between the PbTe and BaF$_2$ materials, either when the diode is formed or, preferably, when a backbias voltage, less than the diode reverse breakdown voltage, is applied across the p-n junction. The diode is particularly suitable for use as an infrared detector typically operated at 80° K.

8 Claims, 4 Drawing Figures

METHOD FOR MAKING AND USING A GROUP IV-VI SEMICONDUCTOR

BACKGROUND OF THE INVENTION

The invention herein described was made in the course of or under a contract, or subcontract thereunder, (or grant) with the Department of the Army.

CROSS-REFERENCE TO RELATED PATENTS AND PUBLICATIONS

The invention herein described was the subject of a publication of the present inventor and the person who assisted him in carrying out experiments related to the invention, this publication being: H. Holloway and K. F. Young, "Low-Capacitance PbTe Photodiodes", *Applied Physics Letters*, Volume 30, No. 4, p. 210 (1977). Related to the subject matter of this invention are U.S. Pat. No. 3,647,197 to Holloway and U.S. Pat. No. 3,779,801 to Holloway et al. Prior art for thin-film IV-VI photodiodes is described in E. M. Logethetis, H. Holloway, A. J. Varga and E. Wilkes, *Applied Physics Letters*, Vol. 19, No. 9, p. 318 (1971), and D. K. Hohnke and H. Holloway, *Applied Physics Letters*, Vol. 24, No. 12, p. 633 (1974). Approaches to the reduction of photodiode capacitance, other than those described herein, are illustrated in A. M. Andrews, J. A. Higgins, J. L. Longo, E. R. Gertner and J. G. Pasko, *Applied Physics Letters*, Vol. 21, No. 6, p. 285 (1972) and in A. M. Andrews, J. L. Longo, J. E. Clarke and E. R. Gertner, *Applied Physics Letters*, Vol. 26, No. 8, p. 438 (1975).

This invention relates to a method for making and using group IV-VI photovoltaic semiconductor diodes. More particularly, the invention concerns a method for substantially reducing the capacitance of group IV-VI thin-film semiconductor photodiodes suitable for use as detectors of infrared radiation in thermal imaging systems.

In thermal imaging systems of this kind, infrared radiation in the 3 to 5 $\mu$m and 8 to 12 $\mu$m bands is of particular interest because of the atmospheric windows existing at these wavelengths. Group IV-VI photodiodes have been found useful in these bands, but are somewhat disadvantageous due to their large junction capacitance. This places a limit on their usefulness at higher detection frequencies in thermal imaging systems because the detectivity $D^*$ of the photodiodes is an inverse function of the product of detection frequency and junction capacitance. Reduction of the group IV-VI photodiode junction capacitance thus is very desirable.

Conventional IV-VI photodiodes have a junction capacitance on the order of 1 $\mu$F per cm$^2$ of junction area. This large capacitance arises from the large dielectric constant of the group IV-VI semiconductor materials (For example, PbTe has a dielectric constant of about 400). The behavior of most conventional IV-VI photodiodes may be approximated by the one-sided abrupt junction, the dynamic capacitance of which is:

$$C = \frac{dQ}{dV} = \left[ \frac{Nq\epsilon}{2(V + V_{bi})} \right]^{\frac{1}{2}} A \qquad (1)$$

where $A$ is the junction area, $N$ is the majority carrier concentration in the bulk of the semiconductor material, $q$ is the magnitude of the charge of an electron, $\epsilon$ is the permittivity of the semiconductor material, $V$ is the voltage applied across the diode junction (positive for backbias) and $V_{bi}$ is the built-in voltage of the diode, which is the potential difference across the junction and is approximately equal to the energy gap divided by the electron charge. For PbTe having a permittivity $\epsilon = 400\epsilon_o$ and $N = 10^{17}$ per cm$^3$, $C/A = 1.2$ $\mu$F per cm$^2$.

A prior art approach to the reduction of junction capacitance is to reduce the carrier concentration N, but, because C is proportional to the square root of N, one order of magnitude reduction in C requires two orders of magnitude reduction in N. This is difficult with IV-VI semiconductors because, even with pure materials, small deviations from stoichiometry produce carrier concentrations on the order of $10^{18}$ per cm$^3$.

SUMMARY OF THE INVENTION

The invention provides a method for making and using a group IV-VI photovoltaic semiconductor diode having a junction capacitance substantially reduced relative to that of conventional diodes employing such materials. In accordance with this method, a group IV-VI semiconductor material is applied as a thin film to a substrate of an insulating material, such as BaF$_2$. This forms a boundary between the insulating and semiconductor materials. The bulk of the semiconductor material is either of $p$ or $n$ type conductivity, but, at a location therein spaced from the boundary, a region is formed of conductivity type opposite to that of the bulk of the semiconductor material. As a result of this, a depletion region exists and a diode is formed in the semiconductor material. The capacitance of the diode is substantially reduced from what it otherwise would be by causing the depletion region to extend to the boundary between the semiconductor material and the insulating substrate. The depletion region may be made to extend to the boundary either by application across the p-n junction of a suitable backbias or by making the film of IV-VI semiconductor material sufficiently thin so that this occurs at zero bias.

DETAILED DESCRIPTION

Figure 1:
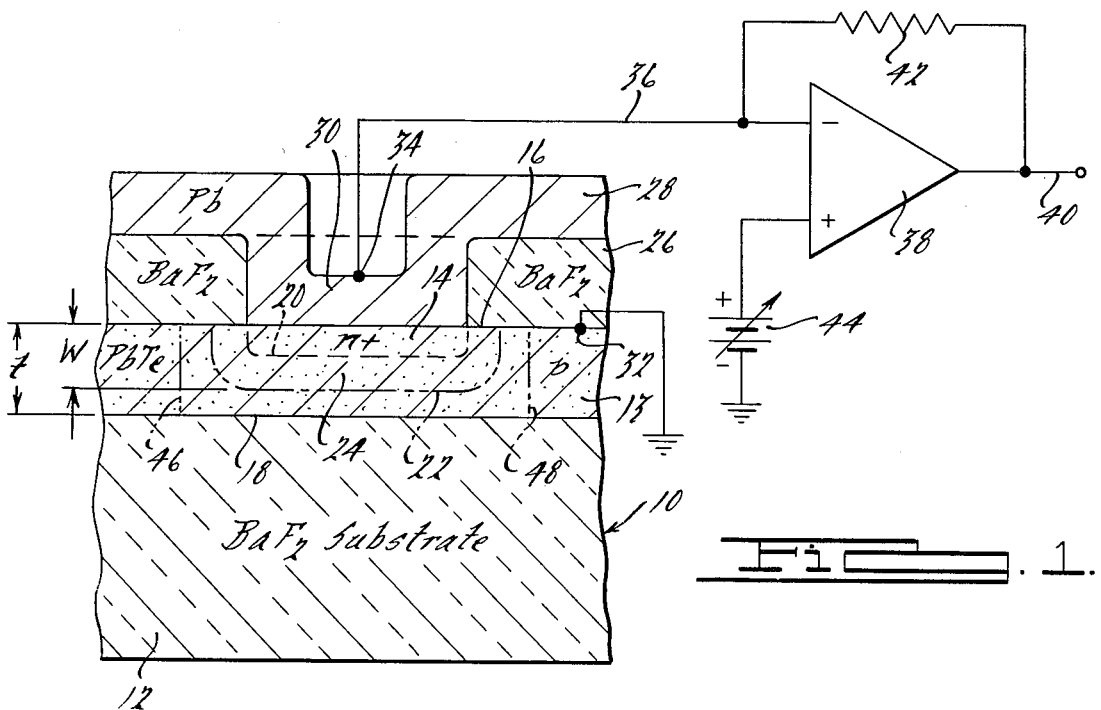
FIG. 1 is a cross-sectional view, much enlarged, of a IV-VI photovoltaic semiconductor diode and associated electrical circuitry.

With reference to the drawings and in particular to FIG. 1, there is shown a photovoltaic group IV-VI semiconductor diode generally designated by the numeral 10. The diode 10 includes a BaF insulating substrate 12 and a thin film 13 of PbTe, a preferred group IV-VI semiconductor material that is epitaxially grown on the cleaved BaF$_2$ substrate. The bulk of the PbTe thin film is of $p$ type conductivity, but an $n+$ region 14 is formed at the surface 16 of the thin film remote from the boundary 18 formed between it and the BaF$_2$ substrate. The dashed line 20 defines the penetration of the n+ region into the bulk of the p type thin film and the dot-dash line 22 denotes the limit of the depletion region 24 that results from the formation of the p-n junction.

Prior to the formation of the n+ region, a film 26 of $BaF_2$ is deposited on the PbTe material, but a preferably square opening is provided to allow the n+ region 14 to be formed. A film 28 of Pb then is deposited on the $BaF_2$ film 26. This metal film 28 is in electrical contact with the n+ region 14 in the square opening location 30 in the insulating $BaF_2$ film 26. The Pb film in contact with the PbTe forms the n+ region 14 and thereby produces a diode structure; it is not entirely clear whether the resulting device is a Schottky barrier diode or a junction diode or perhaps a combination of the two types. It is possible that some of the Pb atoms migrate into the PbTe and assume positions in its lattice structure, thereby, producing the n+ region.

Preferably, the following process steps are used in the fabrication of the diode 10:

1. the PbTe film 13 is epitaxially grown in a vacuum on the cleaved $BaF_2$ substrate 12;
2. the PbTe film 13 is photoresist delineated and is etched using a 5% solution by volume of $Br_2$ in HBr;
3. suitable Pt ohmic contacts 32 are made on the surface 16 of the PbTe by photoresist delineation and deposition by rf sputtering followed by acetone stripping of the resist to delineate the Pt;
4. the $BaF_2$ insulating layer 26 is obtained by vacuum deposition with delineation as in (3) above; and
5. deposition of the Pb film 28 through a close-spaced metal mask or overall followed by a photoresist delineation process.

The inventor has used Shipley A2-1350J photoresist. It is believed that the semiconductor material in diode 10 may become contaminated by alkali ions in the developer used for this photoresist. Therefore, thorough washing of the diodes after each photoresist development is desirable. For this purpose, a 5 to 10 second rinse with running deionized water may be used, followed by about 5 minutes of washing under the condensate from a double still made from vitreous silica. The input to the double still may be water that has previously been deionized and then distilled in a tin-lined still.

The diode 10 has an ohmic contact 34 to the n+ region 14 that, in typical use of the diode, is connected by a lead 36 to the negative input of an amplifier 38 having an output lead 40. A feedback resistor 42 is connected between output lead 40 and input lead 36. A variable DC source 44 is connected between the positive input of amplifier 38 and ground, and the ohmic contact 32 at the p type PbTe in the diode also is connected to ground. The DC source 44 provides a voltage that is applied through the amplifier circuit as a backbias for the diode 10.

With the use of the one sided abrupt junction approximation, the width W of the depletion region 24 is given by the equation:

$$W = \left[ \frac{2\epsilon (V + V_{bi})}{Nq} \right]^{\frac{1}{2}} \quad (2)$$

If the DC source 44 is used to provide a backbias to the p-n junction of diode 10, the limit 22 of the depletion region moves downwardly and outwardly as the backbias voltage is increased. Downward movement of the depletion region limit 22 ceases when this limit reaches the boundary 18 formed between the semiconductor film 13 and the substrate 12 so that the limit then appears as indicated at 46 and 48. When the depletion region limit reaches the boundary 18, there occurs a substantial reduction in the diode junction capacitance, this reduction being directly proportional to the reduction in junction area A that occurs when the depletion region limit reaches the boundary 18.

If desired and as a corollary to the above technique for reducing the junction capacitance of diode 10, the backbias voltage V from source 44 may be 0 and the capacitance reduction may still be obtained if the thickness $t$ of the thin-film semi-conductor material 13 is made less than or equal to the width of the depletion region W, or $$t \leq W = \left[ \frac{2\epsilon V_{bi}}{Nq} \right]^{\frac{1}{2}} \quad (3)$$

For a diode 10 having IV-VI semiconductor material film thickness $t$, the backbias voltage $V_o$ required to cause the depletion region limit to extend to the boundary 18 is given by the equation:

$$V_o = (t^2 Nq/2\epsilon) - V_{bi}. \quad (4)$$

The junction capacitance C is equal to the rate of change of charge Q with respect to the applied voltage V, as indicated in equation (1). When the backbias voltage V is less than $V_o$ so that the depletion region limit 22 does not extend to the boundary 18, a small increase in V produces a large increase in Q, the charge stored in the depletion region, because the volume of the depletion region increases greatly with increases in V. Thus, the junction capacitance is large under this condition. However, when the backbias voltage V exceeds $V_o$ so that the depletion region extends completely through the semiconductor material to the boundary 18, changes in V produce only small changes in the volume of the depletion region and charge Q in such volume or, otherwise stated, dQ/dV is low. The junction capacitance, therefore, is reduced approximately by a factor of the product of the junction periphery and the semiconductor film thickness divided by the junction area.

Figure 2:
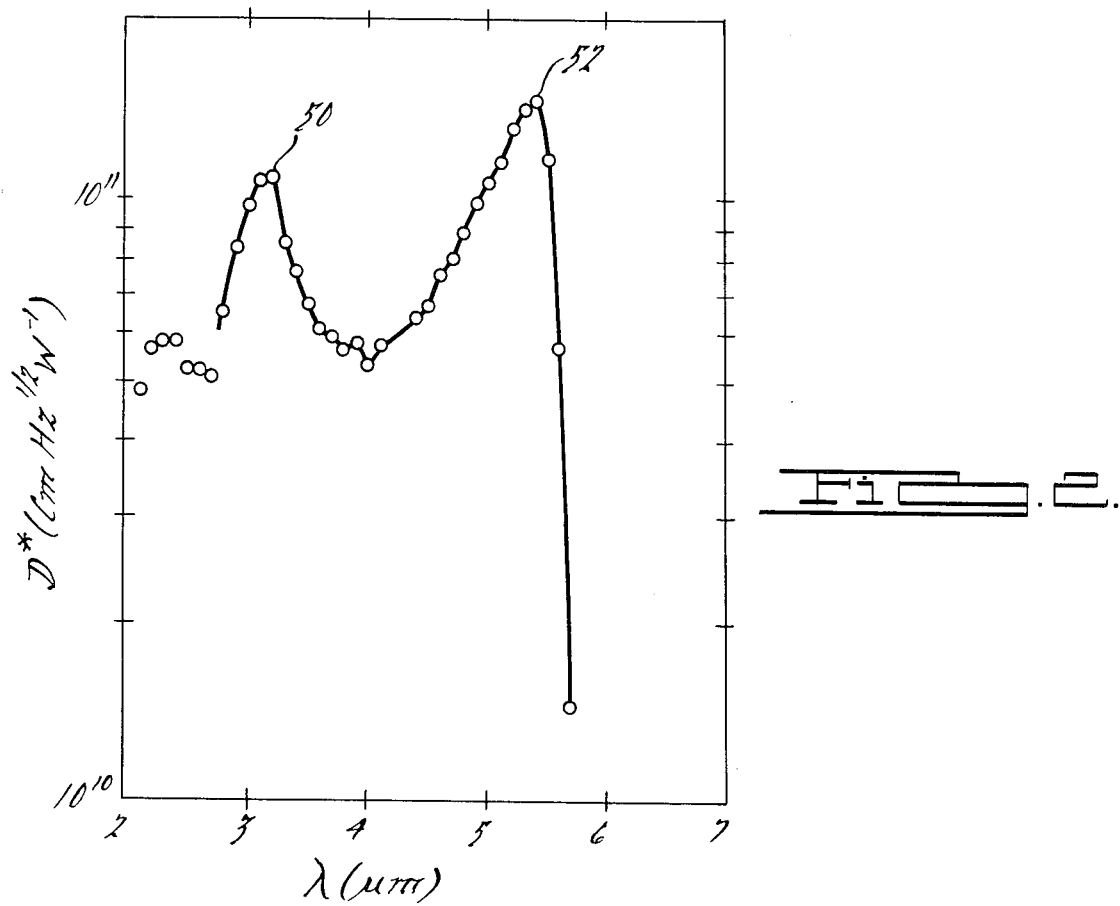
FIG. 2 is a graph of diode detectivity $D^*$ versus wavelength of the radiation incident upon a diode constructed as shown in FIG. 1.

FIG. 2 illustrates the detectivity D* of a PbTe diode constructed in accordance with FIG. 1 as a function of the wavelength of the incident radiation. There are two peaks, 50 and 52, in the diode detectivity. Peak 50 occurs when the thickness $t$ of the PbTe semiconductor material is equal to 5/4 of the wavelength, in the semiconductor material, of the incident radiation. Peak 52 occurs where the thickness of the PbTe is approximately ¾ of the wavelength in the semiconductor material. This indicates the desirability of choosing a thickness $t$ for the thin-film semiconductor material that is an odd multiple of a quarter wavelength in the semiconductor material of the incident radiation to be detected. The inventor has fabricated diodes having a thickness $t$ equal to one quarter of this wavelength for incident radiation in the 3 to 5 μm band. Because these devices had poor thermal stability resulting from the very thin semiconductor film, three-quarter wavelength devices currently are preferred.

The following examples describe devices constructed by the inventor in accordance with the invention.

EXAMPLE 1

This is for a PbTe photodiode that has the configuration of FIG. 2 at zero-bias. The starting material was a layer of PbTe with thickness 0.16 μm on a cleaved BaF$_2$ substrate. The square photodiode, with area 6.0 × 10$^{-4}$ cm$^2$ was made by vacuum deposition of a Pb film and an ohmic contact to the PbTe was made with sputtered Pt. The PbTe film was estimated to have a hole concentration of 10$^{18}$ cm$^{-3}$, for which the zero-bias capacitance of a conventional photodiode with the same area may be calculated to be 2300 pF.

At 78K the measured capacitance of the thin-film photodiode was 42 pF. In part, this value is influenced by stray capacitance that was introduced by our diode configuration and the junction capacitance is believed to be even smaller.

Measurements of the detector parameters at 78K showed that these were within the normal range for high-quality PbTe photodiodes, despite the approximately 50-fold decrease in the junction capacitance. The detector parameters at 5 kHz and 180° field of view were:

| | |
|---|---|
| 500K blackbody current responsivity (R$_I$) | 0.45 AW$^{-1}$ |
| Current noise | 0.70 pA HZ$^{-\frac{1}{2}}$ |
| 500K blackbody detectivity | 1.5 × 10$^{10}$ cm Hz$^{\frac{1}{2}}$W$^{-1}$ |
| Peak detectivity at λ = 4.6 μm | 1.0 × 10$^{11}$ cm Hz$^{\frac{1}{2}}$W$^{-1}$ |

EXAMPLE 2

This is a PbTe photodiode that attains the capacitance reduction on being backbiased by approximately 150 mV. The square diode, with area 6.0 × 10$^{-4}$ cm$^2$ was made as in example 1, except that the PbTe layer had thickness 0.62 μm and hole concentration 1.4 × 10$^{17}$ cm$^{-3}$ for which the calculated zero-bias capacitance is 850 pF. Detector measurements (at 1 kHz and 77K with 10H2 bandwidth) showed no significant change between zero bias and 150 mV backbias, but the capacitance decreased by an order of magnitude. The results for 180° field of view were:

| | At zero bias | At 150 mV backbias |
|---|---|---|
| Capacitance | 700 pF | 73 pF |
| 500K blackbody current responsivity | 0.51 AW$^{-1}$ | 0.51 AW$^{-1}$ |
| Current noise | 0.64 pA Hz$^{-\frac{1}{2}}$ | 0.64 pA Hz$^{-\frac{1}{2}}$ |
| 500K blackbody detectivity | 2.0 × 10$^{10}$cm Hz$^{\frac{1}{2}}$W$^{-1}$ | 2.0 × 10$^{10}$ cm Hz$^{\frac{1}{2}}$W$^{-1}$ |
| Peak detectivity at λ = 5.4 μm | 1.4 × 10$^{11}$ cm Hz$^{\frac{1}{2}}$W$^{-1}$ | 1.4 × 10$^{11}$ cm Hz$^{\frac{1}{2}}$W$^{-1}$ |

Figure 3:
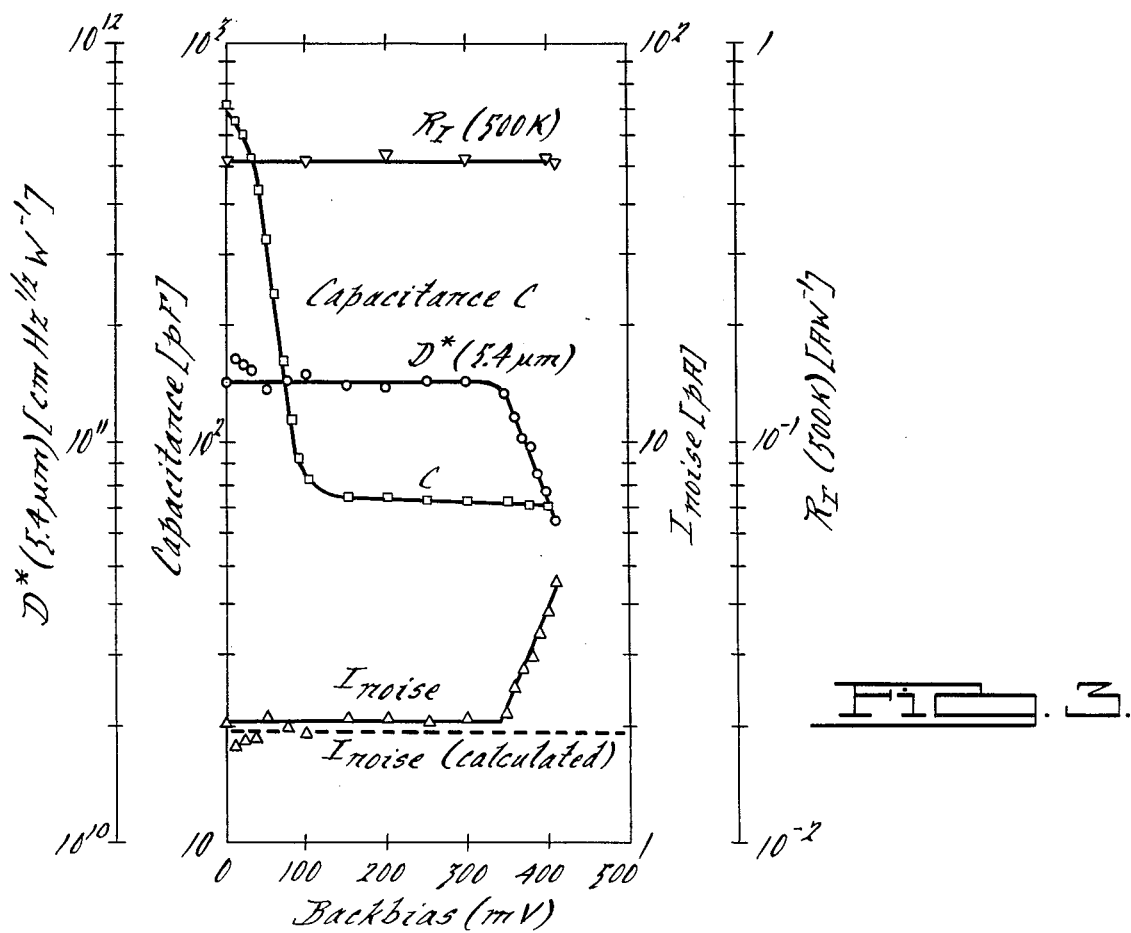
FIG. 3 is a graph illustrating backbias dependent properties of a diode constructed in accordance with FIG. 1 and as specified in Example 2 hereinafter described.

FIG. 3 illustrates the properties of this PbTe photodiode as a function of the backbias voltage V. The rapid decrease in capacitance between 0 and 100 mV backbias should be noted, as should the fact that the responsivity R$_I$ remains unchanged. The noise begins to increase rapidly to give a decrease in the detectivity at a backbias of about 325 mV. This is the bias voltage at which 1/f noise becomes significant and is less than the diode reverse breakdown voltage.

EXAMPLE 3

This device is similar to that in Example 2 except that the junction area is considerably larger. The diode, with area 5.0 × 10$^{-3}$ cm$^2$, has a PbTe film thickness of 0.47 μm and a hole concentration of 4.0 × 10$^{17}$ per cm$^3$. The responsivity R$_I$ and detectivity D* of this photodiode showed no significant change between zero bias and 500 mV backbias, but the capacitance decreased by almost two orders of magnitude. The results for 180° field of view were

| | At Zero Bias | At 150 mV Backbias |
|---|---|---|
| Capacitance | 2810 pF | 35 pF |
| 500K blackbody current responsivity | 0.60 AW$^{-1}$ | 0.60 AW$^{-1}$ |
| Current noise | 1.6 pAHz$^{-\frac{1}{2}}$ | 1.7 pAHz$^{-\frac{1}{2}}$ |
| Peak detectivity at λ = 4.9 μm | 1.9 × 10$^{11}$cm Hz$^{\frac{1}{2}}$W$^{-1}$ | 1.8 × 10$^{11}$cm Hz$^{\frac{1}{2}}$W$^{-1}$ |

Figure 4:
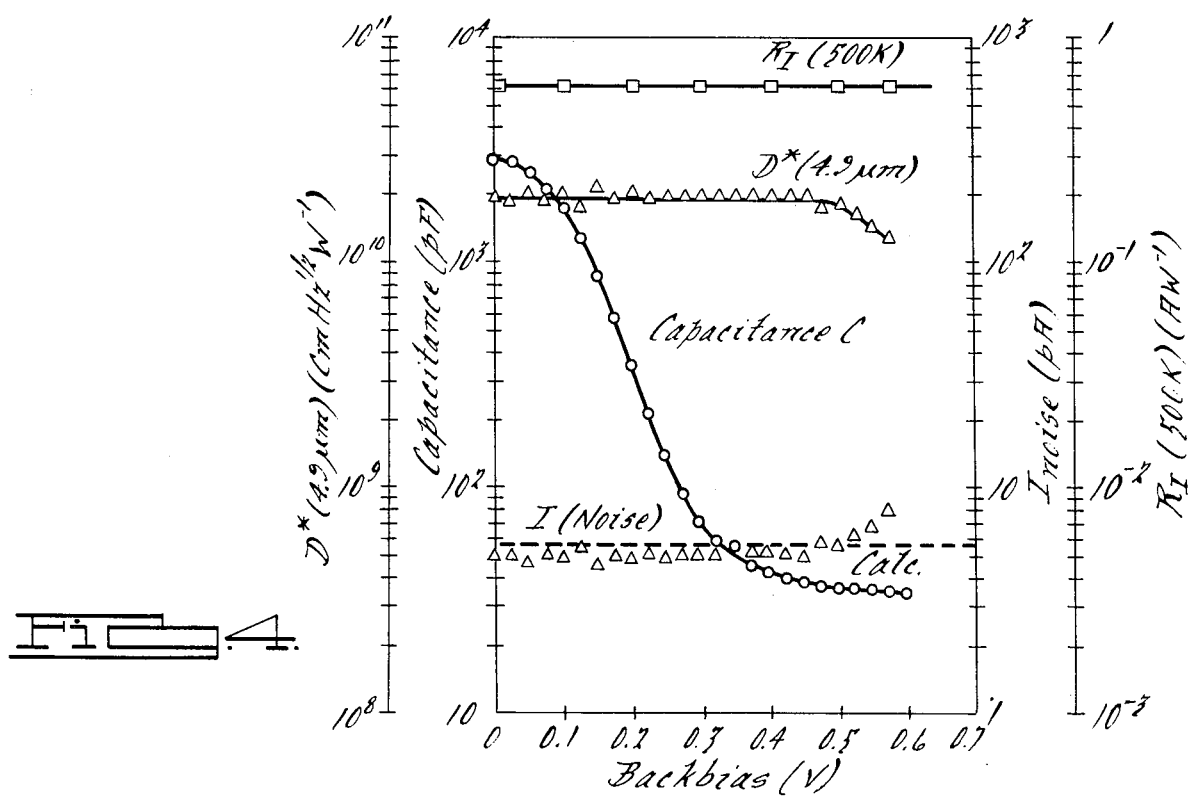
FIG. 4 is a graph illustrating backbias dependent properties of a diode constructed in accordance with FIG. 1 and as specified in Example 3 hereinafter described.

FIG. 4 graphically illustrates the properties of this photodiode. These measurements were made at 77K with a frequency of 1 KHz and a bandwidth of 10 Hz.

In all of the above examples, a BaF$_2$ substrate has a PbTe semiconductor material applied to it and a diode is formed with the addition of a Pb metal film. While this might perhaps be termed a Schottky barrier diode, the p-n junctions might also be made by diffusion, by ion implantation or by substitution of another low work function material, such as Al, In or Ti, for the Pb. Also, the method of the invention is not limited to PbTe semiconductor material on a BaF$_2$ substrate; other group IV-VI semiconductor materials may be used on other insulating substrates, such as CaF$_2$ and SrF$_2$. It is apparent to one of ordinary skill in this art that possible other group IV-VI semiconductor materials include the following:

| | |
|---|---|
| PbS | Pb$_{1-x}$Sn$_x$Se |
| PbSe | Pb$_{1-x}$Sn$_x$Te |
| PbTe | Pb$_{1-x}$Ge$_x$Te |
| PbS$_{1-x}$Se$_x$ | Pb$_{1-x}$Cd$_x$Te |
| PbSe$_{1-x}$Te$_x$ | |

Based upon the foregoing description of the invention, what is claimed is:

1. A method for making and using a group IV-VI photovoltaic semiconductor diode comprising the steps of:

applying, to a substrate of an insulating material, a thin film of a group IV-VI semiconductor material of p type or n type conductivity, a boundary thereby being formed between said insulating and semiconductor materials;

in said semiconductor material and at a location therein spaced from said boundary, forming a region of conductivity type opposite to that of the bulk of said semiconductor material, a depletion region and a diode thereby being formed in said semiconductor material;

causing said depletion region to extend to said boundary, thereby, to reduce substantially the capacitance of said diode relative to the capacitance said diode would have were said depletion region not to extend to said boundary.

2. A method according to claim 1 wherein the thickness of said semiconductor material is limited such that a backbias voltage, including zero voltage and less than the reverse breakdown voltage of said diode, applied to said diode across said region of opposite conductivity type and said bulk of said semiconductor material, causes said depletion region to extend to said boundary.

3. A method according to claim 2 wherein said backbias voltage applied to said diode is approximately equal to or greater than the voltage $V_o$ defined by the equation:

$$V_o = (t^2 Nq/2\epsilon) - V_{bi}$$

wherein $t$ is the thickness of said thin film of semiconductor material, $N$ is the majority carrier concentration in said bulk of said semiconductor material, $q$ is the unit positive charge equal in magnitude to the charge of an electron, $\epsilon$ is the static permittivity of said semiconductor material and $V_{bi}$ is the built-in voltage inherent in said diode.

4. A method according to claim 3 wherein said group IV-VI semiconductor material is a material selected from the group consisting of: PbS; PbSe; PbTe; $Pb_{1-x}Sn_xTe$ ($0 \leq x \leq 0.4$); $Pb_{1-x}Sn_xSe$ ($0 \leq x \leq 0.2$); $PbSe_{1-x}Te_x$ ($0 \leq x \leq 1$); $PbS_{1-x}Se_x$ ($0 \leq x \leq 1$); $Pb_{1-x}Ge_xTe$ ($0 \leq x \leq 0.1$); and $Pb_{1-x}Cd_xTe$ ($0 \leq x \leq 0.1$).

5. A method according to claim 4 wherein said region of conductivity type opposite to that of the bulk of said semiconductor material is of $n+$ conductivity type and wherein the bulk of said semiconductor material is of $p$ conductivity type.

6. A method according to claim 5 wherein said region of $n+$ conductivity type is formed by depositing Pb on the surface of said semiconductor material remote from said insulating material.

7. A method according to claim 5 wherein said semiconductor material is PbTe.

8. A method according to claim 6 wherein said semiconductor material is PbTe.

* * * * *